(12) United States Patent
Sakamoto et al.

(10) Patent No.: US 9,682,821 B2
(45) Date of Patent: Jun. 20, 2017

(54) ARTICLE TRANSPORT FACILITY

(71) Applicant: Daifuku Co., Ltd., Osaka-shi (JP)

(72) Inventors: Junichi Sakamoto, Hinocho (JP);
Hideo Yoshioka, Hinocho (JE)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 15/352,956

(22) Filed: Nov. 16, 2016

(65) Prior Publication Data

US 2017/0137220 A1 May 18, 2017

(30) Foreign Application Priority Data

Nov. 17, 2015 (JP) .................................. 2015-225076

(51) Int. Cl.
*G06F 7/00* (2006.01)
*B65G 1/04* (2006.01)
*B65G 1/06* (2006.01)

(52) U.S. Cl.
CPC ............... *B65G 1/045* (2013.01); *B65G 1/06* (2013.01); *B65G 2201/0297* (2013.01)

(58) Field of Classification Search
USPC ........................................................ 700/214
See application file for complete search history.

(56) References Cited

U.S. PATENT DOCUMENTS 8,189,867 B2  5/2012  Yoshioka

FOREIGN PATENT DOCUMENTS

JP          201083593 A    4/2010

*Primary Examiner* — Kyle Logan
(74) *Attorney, Agent, or Firm* — The Webb Law Firm

(57) ABSTRACT

An article transport facility comprises storage sections, a transport device, a controller, and a learning module. The transport device has a transfer device having a support portion, and a light-emitter-receiver. The controller is caused to store information that indicates a second target position at which the transfer device is located when transferring an article, and information that indicates a first target position to which the support portion is moved. Each of a plurality of storage sections is provided with a reflector. A learning control performed by the controller is a control in which a first target position and a second target position are learned based on information of an image of the reflector captured by the imaging device of the learning module and pre-learning position information. Each reflector has a first area which forms the periphery of the reflector, and a second area in the first area. The relationship between the reflectance and the wave length of the reflected light is different between the first area and the second area.

5 Claims, 9 Drawing Sheets

ARTICLE TRANSPORT FACILITY

CROSS-REFERENCE TO RELATED APPLICATION

This application claims priority to Japanese Patent Application No. 2015-225076 filed Nov. 17, 2015, the disclosure of which is hereby incorporated in its entirety by reference.

FIELD OF THE INVENTION

The present invention relates to an article transport facility comprising a plurality of storage sections, a transport device configured to transport an article to any one of the plurality of storage sections, a controller for controlling operation of the transport device, and a learning module.

BACKGROUND

An example of article transport facilities such as one described above is disclosed in JP Publication of Application No. 2010-083593 (Patent Document 1). In the article transport facility of Patent Document 1, an article is transferred between a support member and a storage section by moving the support member between a reference position and a first target position after a transfer device is moved to a second target position. More specifically, when transferring an article from the support portion to a storage section by means of the transport device, the support portion is projected from the reference position to the first target position with the transfer device located at an upper second target position, and subsequently the transfer device is lowered to a lower second target position to unload the article in the storage section. And then, the support portion is retracted from the first target position to the reference position. When transferring an article from a storage section to a support portion with the transport device, the movements are reversed from those for transferring an article from the support portion to a storage section with the transport device.

And in the article transport facility of Patent Document 1, a module used for a learning operation ("learning module" for short) is provided with a pair of monocular imaging devices. When learning the first target position and the second target positions for a storage section that is a target of learning, it is done by capturing images of a reflecting plate with the pair of imaging devices with the learning module supported by the transfer device and with the transfer device located at a pre-learning position which corresponds to the storage section that is the target of learning. And the learning of the first target position and the second target position for the storage section that is the target of learning is done based on information on the images captured by the pair of imaging devices and information indicating the pre-learning position.

SUMMARY OF THE INVENTION

With the article transport facility of the Patent Document 1 described above, one of the pair of imaging devices is provided to be pointed straight forward whereas the other imaging device is provided to be pointed at an angle. Thus, it is necessary to locate the imaging devices so that they are spaced apart from each other, which tends to increase the size of the learning module. In addition, two imaging devices need to be provided to the learning module, which tends to increase the manufacturing cost of the learning module.

To solve this problem, it is conceivable to provide only one monocular imaging device to the learning module, and to learn the first target position and the second target position for a storage section that is the target of learning based on information on the image of a reflecting plate captured by this one imaging device and information indicating the pre-learning position. However, if arrangement is such as to learn the first target position and the second target position based on information on the image of the reflecting plate captured by this one imaging device, then, it would be necessary to more properly or accurately recognize or determine the shape and the size of a reflecting plate based on the image captured by the imaging device.

Therefore, an article transport facility would be desired in which reflecting plates are provided that would allow their shape and size to be recognized or determined properly when their images are captured by the imaging device.

In light of the above, an article transport facility comprises a plurality of storage sections, a transport device configured to transport an article to any one of the plurality of storage sections, a controller for controlling operation of the transport device; and a learning module.

The transport device has a transfer device having a support portion configured to support an article, a first actuator configured to move the transfer device, and a light-emitter-receiver configured to be moved integrally with the transfer device, wherein the transfer device is provided with a second actuator configured to move the support portion, and is configured to transfer an article between the support portion and a storage section by moving the support portion between a reference position and a first target position at which the support portion is projected from the reference position in a direction in which the storage section is located, wherein, for each of the plurality of storage sections, the controller stores information that indicates a second target position at which the transfer device is located when the transfer device transfers an article between the support portion and the storage section, as well as information that indicates the first target position, wherein the light-emitter-receiver is positioned to emitted light along a projecting direction which points toward the first target position from the reference position, wherein each of the plurality of storage sections is provided with a reflector configured to reflect light from the light-emitter-receiver back toward the light-emitter-receiver when the transfer device is located at a proper position which is a proper position for the transfer device with respect to the storage section, wherein the learning module has only one monocular imaging device configured to capture an image of the reflector, wherein the controller is configured to perform a movement control and a learning control, wherein the movement control is a control for causing the first actuator and the second actuator to operate to cause the transfer device to be moved to a second target position that corresponds to the storage section that is a target of transfer, and subsequently to cause the support portion to be moved from the reference position to the first target position if the reflector is reflecting the light emitted by the light-emitter-receiver and the light-emitter-receiver is receiving the reflected light, wherein the learning control is a control for learning the first target position and the second target position for a storage section that is a target of learning, based on: (a) information of an image of the reflector captured by the imaging device with the learning module supported by the transfer device and with the transfer device located at a pre-learning position that corresponds to a storage section that is a target of learning; and (b) information indicating the pre-learning position, wherein the reflector has a first area which forms a periphery of the reflector as seen along the projecting direction, and a second area surrounded by the first area in the first area, and wherein a relationship between reflectance and wave length of reflected light for the first area is different from a relationship between reflectance and wave length of reflected light for the second area.

With the arrangement above, the controller can transfer an article between the support portion and a storage section by performing the movement control to first cause the transfer device to be moved to the second target position for the storage section, and subsequently to cause the support member to be moved between the reference position and the first target position.

In addition, by performing the learning control, the controller can learn the first target position and the second target position for the storage section that is the target of learning based on (a) information of an image of the reflector captured by the imaging device with the learning module supported by the transfer device and with the transfer device located at the pre-learning position that corresponds to the storage section that is the target of learning, and (b) information indicating the pre-learning position.

And by capturing an image of the reflector that reflects the light from the light-emitter-receiver with the imaging device, it is not necessary to provide each storage section with a separate member of which the imaging device captures an image in a learning control, which simplifies the structure of each storage section. In addition, since the learning module has only one monocular imaging device, any increase in size or in manufacturing cost of the learning module can be reduced compared with the case in which two monocular imaging devices are provided to a learning module.

In addition, the reflector has a first area which forms a periphery of the reflector as seen along the projecting direction, and a second area surrounded by the first area in the first area. And the relationship between reflectance and wave length of reflected light for the first area is different from the relationship between reflectance and wave length of reflected light for the second area. Thus, the controller can recognize or determine the size and shape of the reflector based on the size and the shape of the second area in addition to the size and the shape of the periphery of the first area, in an image captured by the imaging device, which makes it easier for the controller to recognize or determine the size and the shape of the reflector based on an image captured by the imaging device.

In addition, since at least a portion of the second area formed in the first area is surrounded by the first area, even when the periphery of the first area that forms the periphery of the reflecting plate is hard to be recognized due to some external light, at least a portion of the second area is located inside the periphery of the reflecting plate and is thus less susceptible to such external light, which makes it easier to recognize or determine the size and the shape of at least a part of the second area.

Thus, the article transport facility can be provided with reflecting plates that allow their shape and size to be recognized or determined properly when their images are captured by the imaging device.

DETAILED DESCRIPTION

Embodiments of an article transport facility are described next with reference to the drawings.

Figure 1:
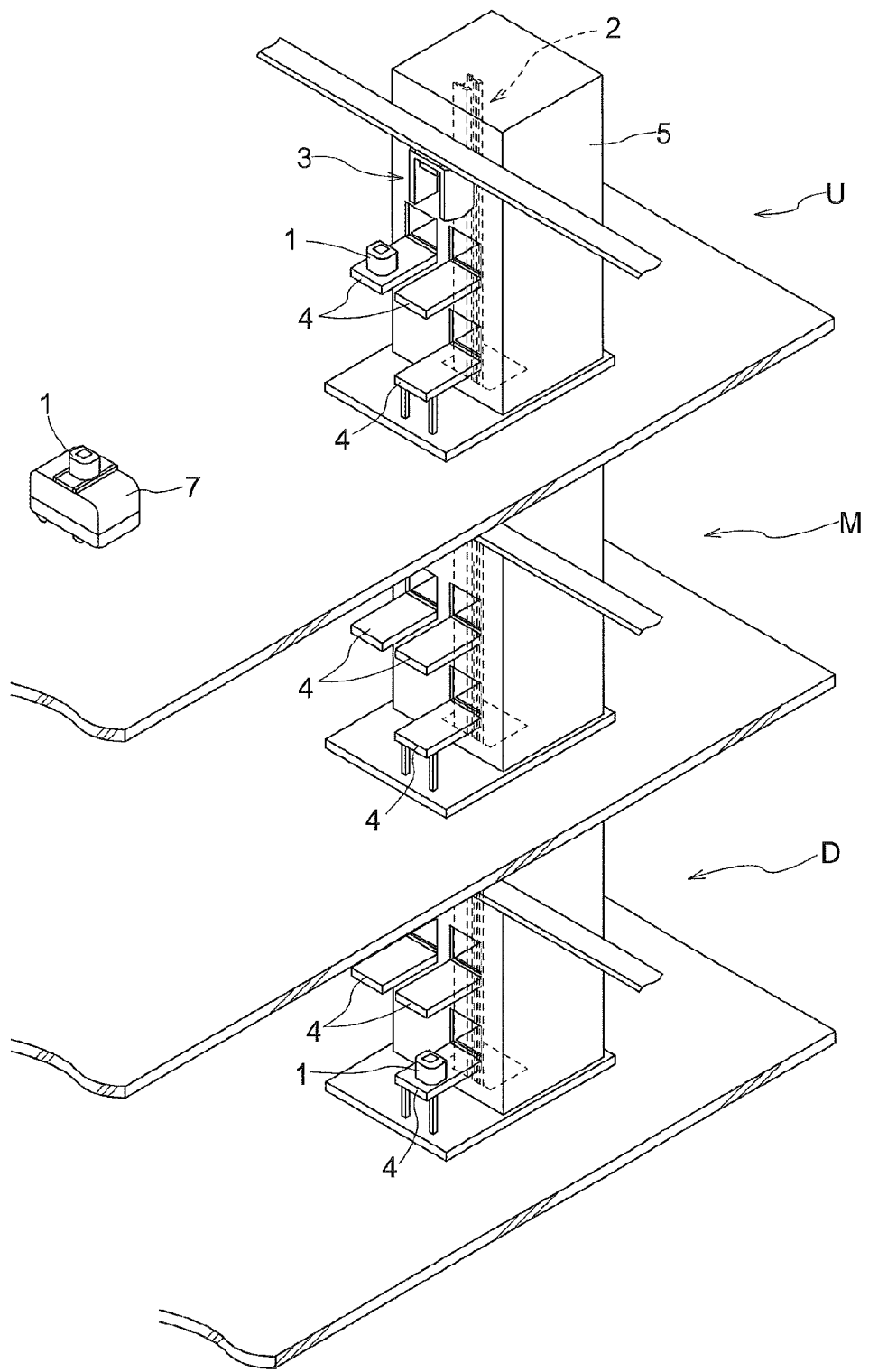
FIG. 1 is a perspective view of an article transport facility.

As shown in FIG. 1, the article transport facility includes a raising-and-lowering transport device 2 for transporting containers 1 (one container 1 at a time with each container being an article to be transported) inclusively between a plurality of floors (which will be referred to as, from top to bottom, the upper floor U, the intermediate floor M, and the lower floor D), one or more ceiling, or overhead, transport vehicles 3 configured to travel near the ceiling to transport the containers 1 one container 1 at a time, one or more floor surface transport vehicles 7 each configured to travel on a floor surface to transport the containers 1 one container 1 at a time, and carry-in-and-out transport devices 4 each of which is fixedly installed to transport the containers 1.

Note that each container 1 (article) is a FOUP (Front Opening Unified Pod) for holding one or more semiconductor substrates.

Figure 2:
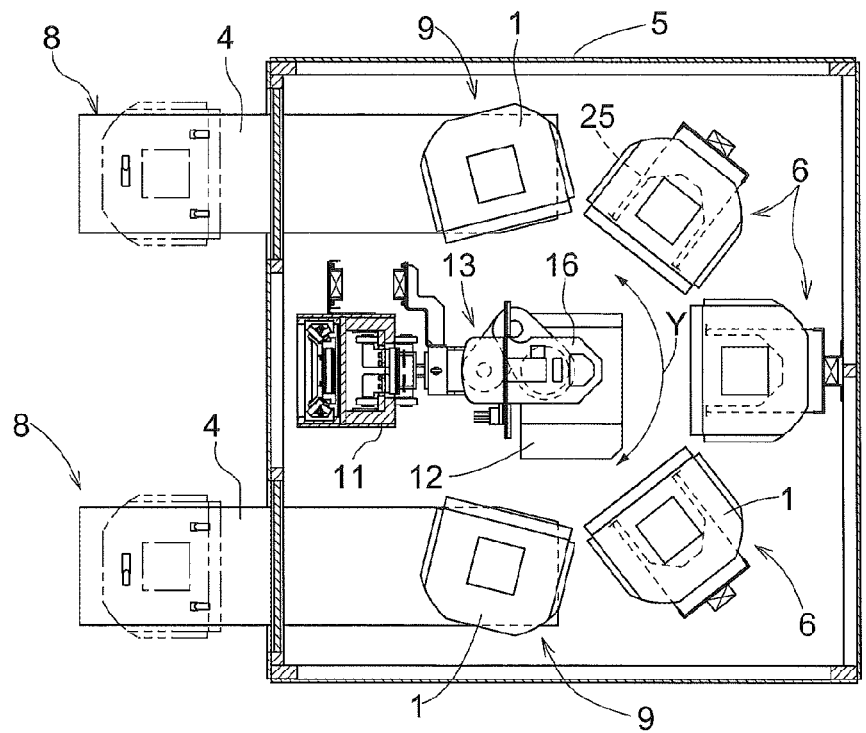
FIG. 2 is a cross-sectional plan view showing a vertical level of a raising-and-lowering transport device at which a pair of carry-in-and-out transport devices are provided.
Figure 3:
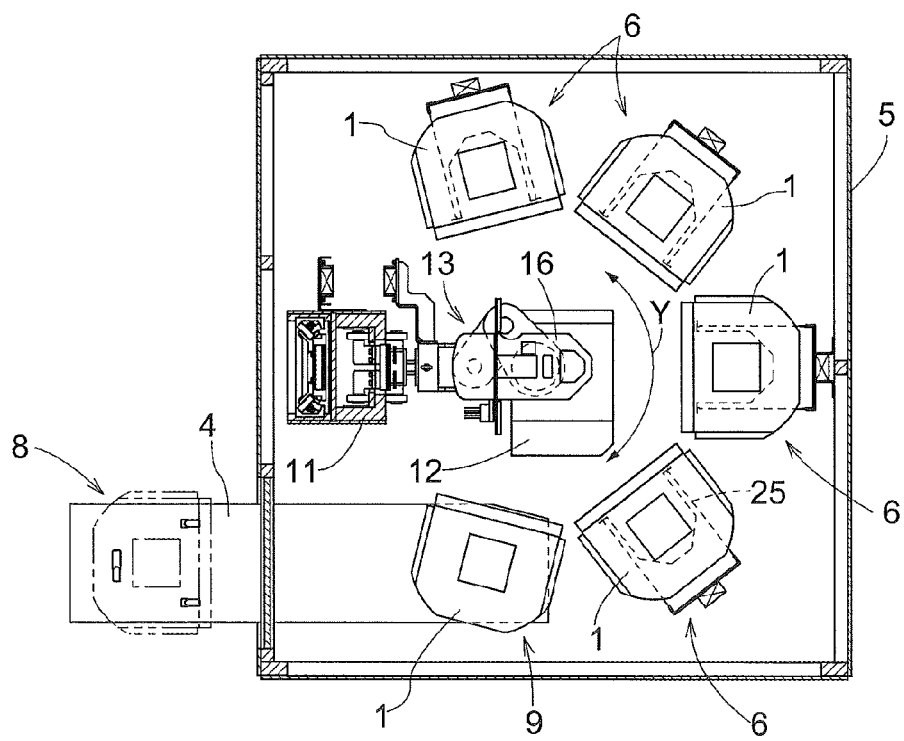
FIG. 3 is a cross-sectional plan view showing another vertical level of a raising-and-lowering transport device at which one carry-in-and-out transport device is provided.
Figure 4:
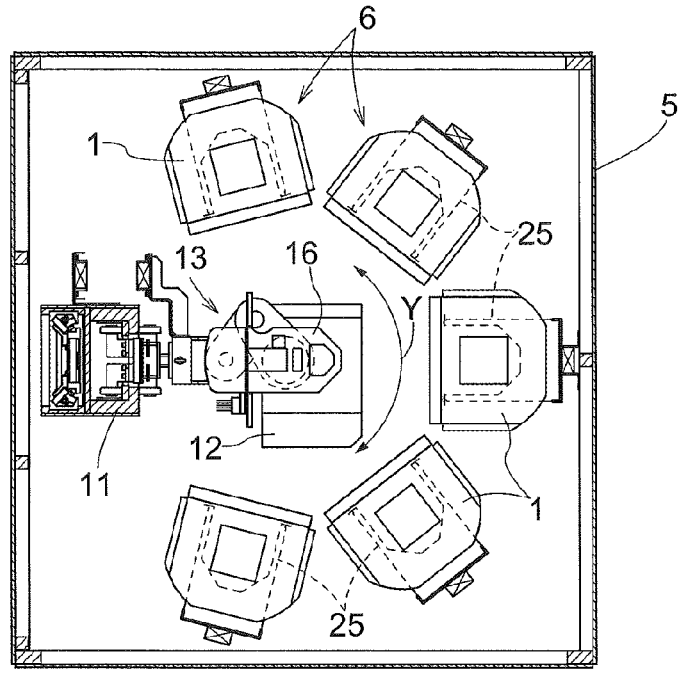
FIG. 4 is a cross-sectional plan view showing another vertical level of a raising-and-lowering transport device at which no carry-in-and-out transport device is provided.

As shown in FIG. 1, the raising-and-lowering transport device 2 is provided within a tubular member 5 to extend inclusively between the upper floor U and the lower floor D. The ceiling transport vehicles 3 and the floor surface transport vehicles 7 are provided outside the tubular member 5. As shown in FIG. 2 and FIG. 3, each carry-in-and-out transport device 4 is provided to extend from inside to outside of the tubular member 5 to transport containers 1 one at a time between an outside location 8 located outside of the tubular member 5 and an inside location 9 located inside the tubular member 5. As shown in FIGS. 2-4, a plurality of storage sections or locations 6 each for storing a container 1 are located within the tubular member 5.

In this article transport facility, when a container 1 is placed at an outside location 8 of a carry-in-and-out transport device 4 by a ceiling transport vehicle 3, a floor surface transport vehicle 7, or a worker, the container 1 is transported from the outside location 8 to the inside location 9 by the carry-in-and-out transport device 4. Subsequently, the container 1 is transported by the raising-and-lowering transport device 2 from the inside location 9 to one of the storage sections 6 at which the container is stored.

Also, a container 1 stored at a storage section 6 is transported from the storage section 6 to an inside location 9 of a carry-in-and-out transport device 4 by the raising-and-lowering transport device 2. Subsequently, the container 1 is supported and transported from the inside location 9 to the outside location 8, by the carry-in-and-out transport device 4. The container 1 at the outside location 8 is then picked up or removed from the outside location 8 by a ceiling transport vehicle 3, a floor surface transport vehicle 7, or a worker.

Note that the raising-and-lowering transport device 2 is, or corresponds to, the transport device configured to transport an article to any one of the storage sections 6. In addition, a container 1 may be transported from one inside location 9 to another inside location 9 by the raising-and-lowering transport device 2.

[Raising-and-Lowering Transport Device]

As shown in FIGS. 2-4, the raising-and-lowering transport device 2 includes a guide rail 11 installed along a vertical direction X, a vertically movable member 12 configured to be moved along the guide rail 11 thus along the vertical direction X, and a transfer device 13 having a support portion 16 configured to support a container 1. In addition, as shown in FIGS. 5-7, the raising-and-lowering transport device 2 further includes a turning device 14 which is located between the vertically movable member 12 and the transfer device 13 and which is configured to rotate the transfer device 13 about a rotation axis P, and light-emitter-receivers 15.

The transfer device 13 has a linkage mechanism 17 (such as an articulated (robotic) arm), in addition to the support portion 16. The base portion of the linkage mechanism 17 is connected to the turning device 14 whereas the distal end portion of the linkage mechanism 17 is connected to the support portion 16.

Figure 5:
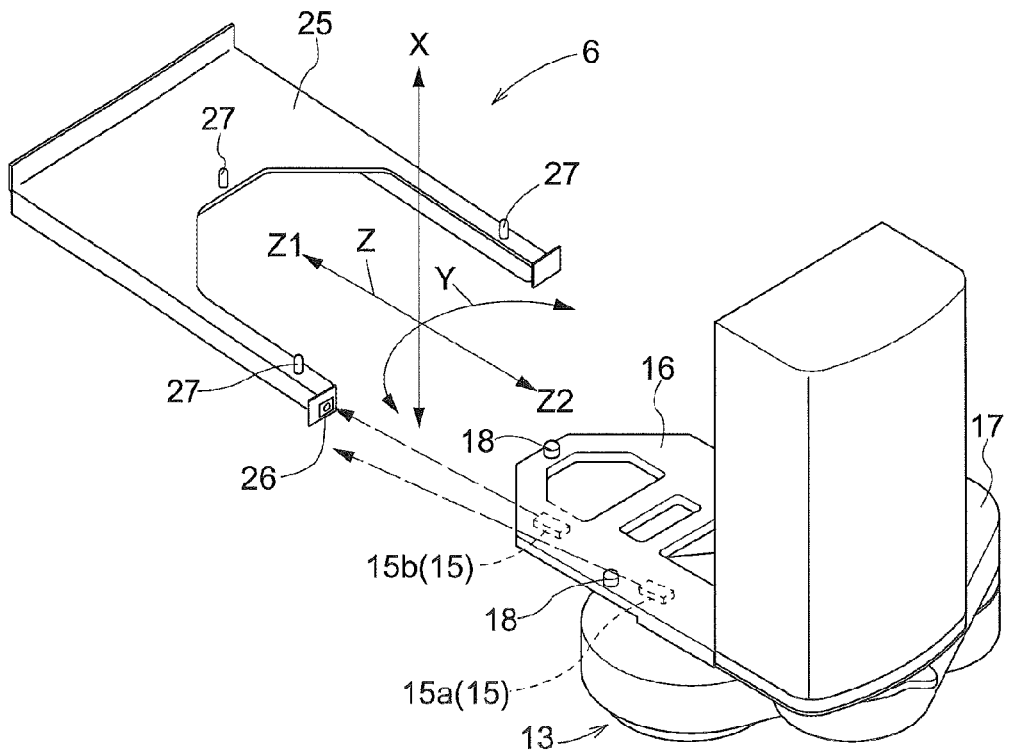
FIG. 5 is a perspective view showing a storage section and a transfer device.
Figure 6:
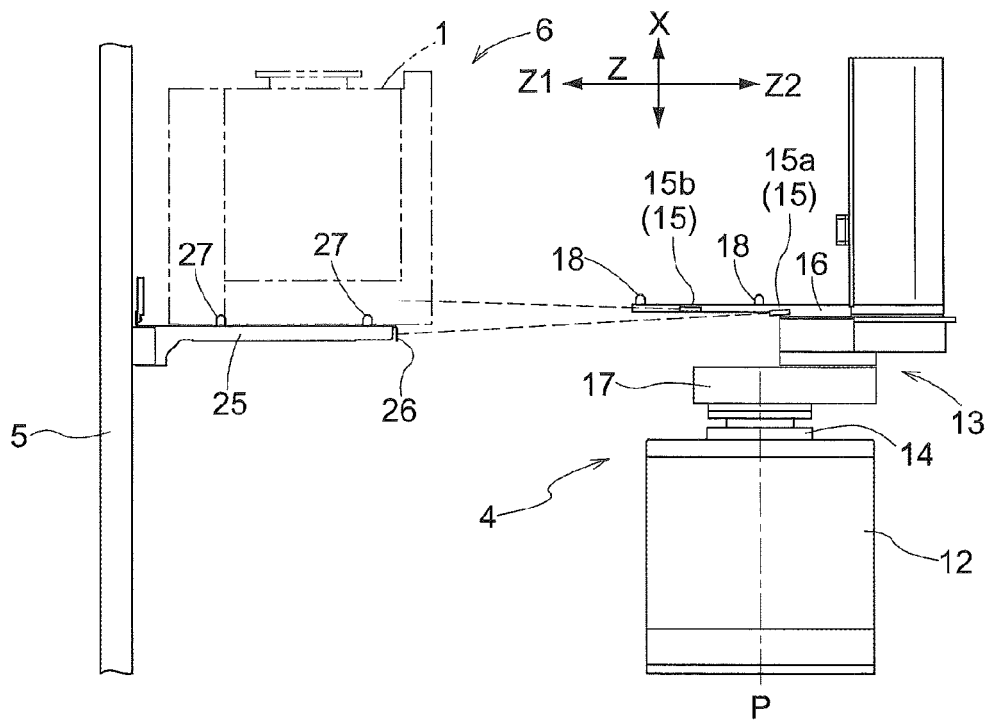
FIG. 6 is a side view showing a storage section and the transfer device located at an upper second target position.
Figure 7:
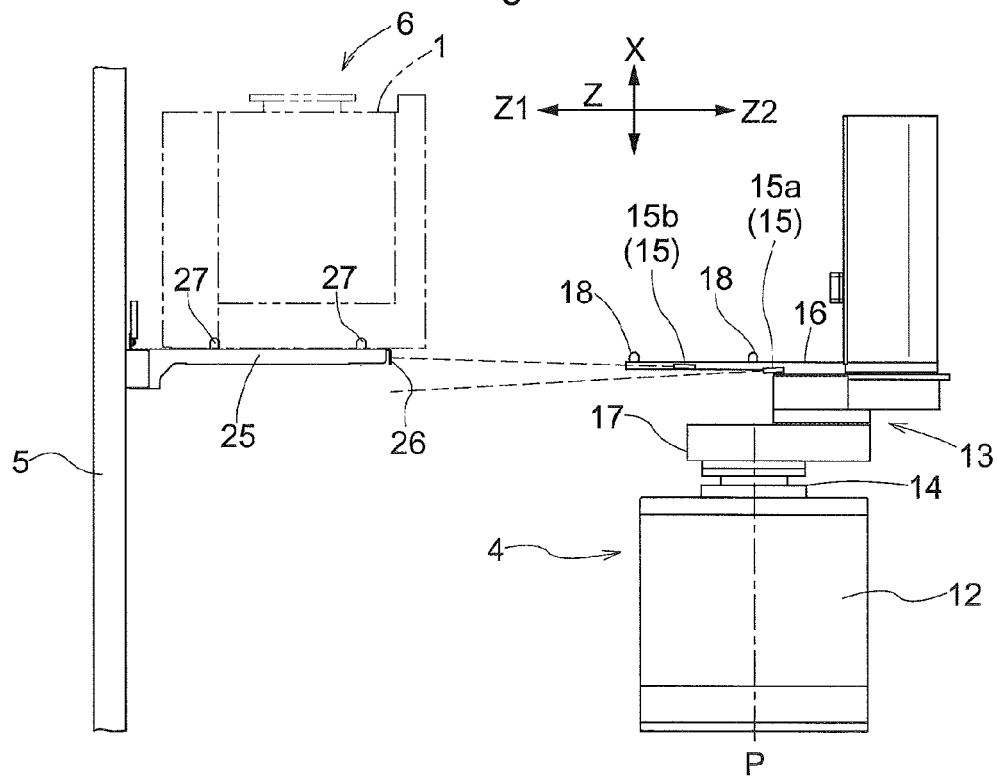
FIG. 7 is a side view showing a storage section and the transfer device located at an lower second target position.

As shown in FIGS. 5-7, the support portion 16 has three first engaging portions 18 configured to engage recessed portions formed in the bottom portion of each container 1. And the support portion 16 is configured to support a container 1 from below with the container 1 properly positioned in horizontal directions with the three first engaging portions 18 in engagement with respective recessed portions of the container 1.

Each light-emitter-receiver 15 is configured to emit light in a projecting direction Z1 as seen along the vertical direction X and is supported by the support portion 16 such that it is moved integrally with the transfer device 13. And the light-emitter-receivers 15 consist of a pair of light-emitter-receivers 15 supported by the support portion 16, namely a first light-emitter-receiver 15a which emits light in the projecting direction Z1 as seen along the vertical direction and in a diagonally downward direction (i.e., emits light in a direction which has its horizontal component in the projecting direction Z1 and which also has a downward component), and a second light-emitter-receiver 15b which emits light in the projecting direction Z1 as seen along the vertical direction and in a diagonally upward direction (i.e., emits light in a direction which has its horizontal component in the projecting direction Z1 and which also has an upward component). The first light-emitter-receiver 15a is installed at a lower position than the second light-emitter-receiver 15b.

Figure 11:
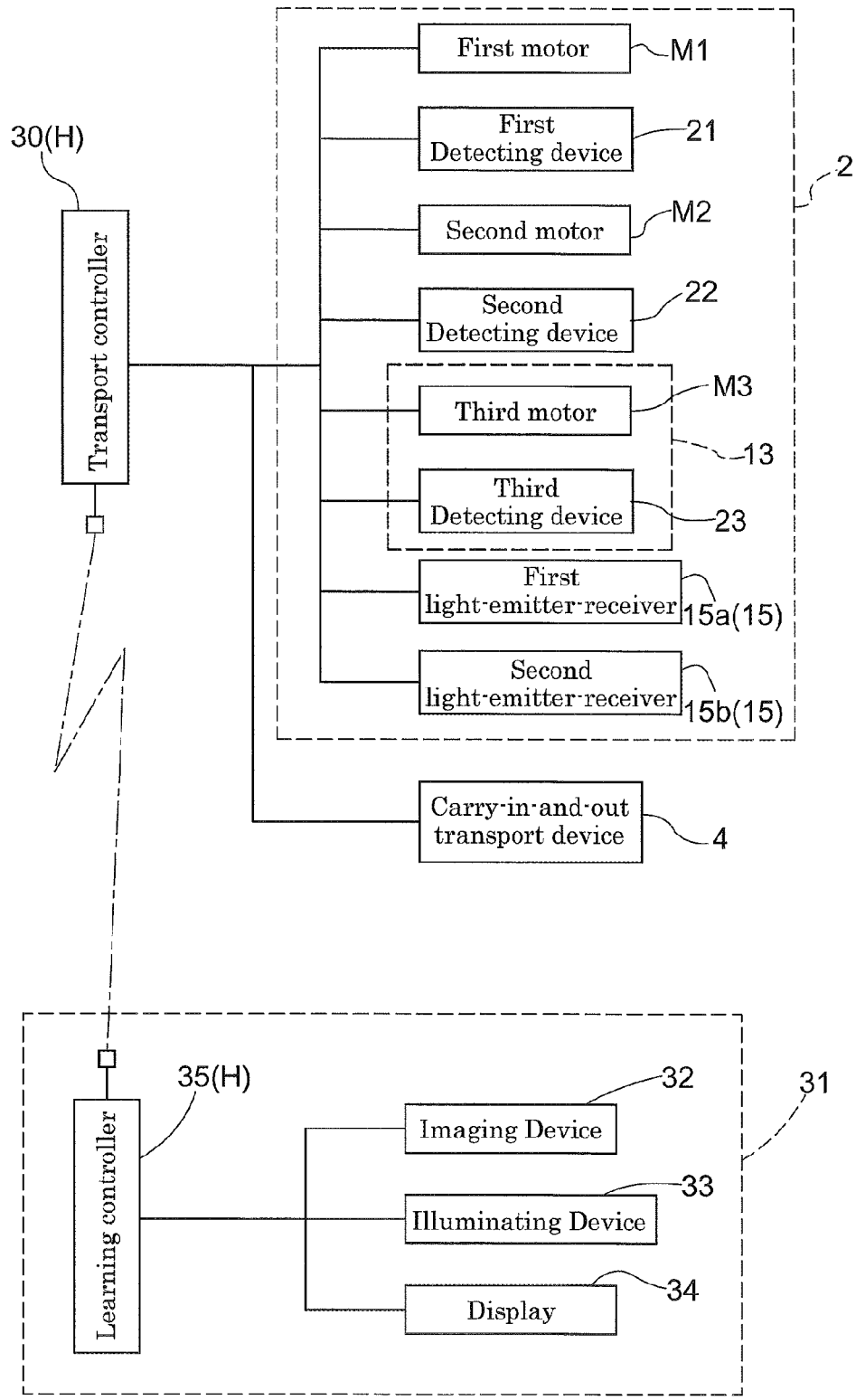
FIG. 11 is a block diagram of components related to controlling.

As shown in FIG. 11, the raising-and-lowering transport device 2 has a first motor M1 for moving the vertically movable member 12 along the vertical direction X, and a second motor M2 for actuating the turning device 14 to rotate or turning the transfer device 13 along a circumferential direction Y (i.e., through an angle in a horizontal plane). The transfer device 13 has a third motor M3 for extending and contracting the linkage mechanism 17 to project and retract the support portion 16 along a projecting and retracting direction Z.

And the transfer device 13 is configured such that, as the vertically movable member 12 is vertically moved by the actuating force of the first motor M1, the transfer device 13 is also vertically moved, integrally with the vertically movable member 12. In addition, the transfer device 13 is configured to be moved along the circumferential direction Y (i.e., turned through an angle in a horizontal plane) by actuating the turning device 14 by the actuating force of the second motor M2. In addition, the transfer device 13 is configured such that, by extending and contracting the linkage mechanism 17 by the actuating force of the third motor M3, the support portion 16 can be moved to a reference position at which the support portion 16 is retracted (i.e. in a retracted state) and is directly above the vertically movable member 12 (for example, is at a position at which the support portion 16 overlaps with the vertical movable member 12 as seen along the vertical direction X) and a first target position at which the support portion 16 is projected from (i.e., in a projected state relative to) the reference position in a direction in which a storage section 6 or an inside location 9 is located.

Note that the first motor M1 is, or correspond to, the vertical movement actuator for moving the transfer device 13 along the vertical direction X, and that the second motor M2 is, or correspond to, the rotating movement actuator for rotating the transfer device 13 about a rotation axis P extending along the vertical direction X. And the first actuator configured to move the transfer device 13 includes the vertical movement actuator and the rotating movement actuator. In addition, the third motor M3 is, or correspond to, the second actuator configured to move the support portion 16.

The raising-and-lowering transport device 2 includes a first detecting device 21 for detecting the position, along the vertical direction X, of the transfer device 13 and a second detecting device 22 for detecting the position along the circumferential direction Y (i.e., angular position in the horizontal plane) of the transfer device 13. In addition, the transfer device 13 also has a third detecting device 23 for detecting the position, along the projecting and retracting direction Z, of the support portion 16.

Detecting devices, such as rotary encoders and laser range finders, are used as the first detecting device 21, the second detecting device 22, and the third detecting device 23. In the present embodiment, a laser range finder, which detects the distance along the vertical direction X from the reference position to the vertically movable member 12, is used as the first detecting device 21: a rotary encoder, which outputs pulses as the transfer device 13 is moved or turned along the circumferential direction Y (i.e., through an angle in the horizontal plane), is used as the second detecting device 22: and a rotary encoder, which outputs pulses as the support portion 16 is projected and retracted, is used as the third detecting device 23. And a transport controller 30 described below determines: the position, along the vertical direction X, of the transfer device 13 based on information that indicates the distance from a vertical movement reference position to the vertically movable member 12 detected by the first detecting device 21; the position along the circumferential direction Y (i.e., angular position in the horizontal plane) of the transfer device 13 by counting the number of pulses outputted by the second detecting device 22; and the position, along the projecting and retracting direction Z, of the support portion 16 by counting the number of pulses outputted by the third detecting device 23.

For each of the plurality of storage sections 6, a first target position is set for transferring a container 1 between the support portion 16 and the storage section 6 by the transfer device 13 (i.e., the position of the support portion 16 with respect to the reference position). For each of the plurality of storage sections 6, second target positions, at which the transfer device 13 is, or should be, located when transferring a container 1 between the support portion 16 and the storage section 6 by the transfer device 13, are set in advance.

Each second target position is specified by its position along the vertical direction X, and its position along the circumferential direction Y (i.e., angular position in the horizontal plane). In addition, set as the second target positions are an upper second target position (see FIG. 6) at which the transfer device 13 is, or should be, located when projecting the support portion 16 from the reference position to initiate a transfer of a container 1 from the support portion 16 to a storage section 6, and a lower second target position (see FIG. 7) at which the transfer device 13 is, or should be, located when projecting the support portion 16 from the reference position to initiate a transfer of a container 1 from a storage section 6 to the support portion 16.

Note that a first target position and second target positions are set for each of the plurality of the inside locations 9 as with the storage sections 6.

How the raising-and-lowering transport device 2 transfers a container 1 from the support portion 16 to a storage section 6 is described next. First, the raising-and-lowering transport device 2 vertically moves and rotates the transfer device 13 which is supporting a container 1 to move the transfer device 13 to the upper second target position that corresponds to the storage section 6 which is the target of the transfer process (target storage section, for short). Next, after the support portion 16 is projected from the reference position to the first target position, the raising-and-lowering transport device 2 lowers the transfer device 13 to the lower second target position to unload the container 1 in the storage section. Subsequently, the support portion 16 is retracted from the first target position to the reference position.

How the raising-and-lowering transport device 2 transfers a container 1 from a storage section 6 to the support portion 16 is described next. First, the raising-and-lowering transport device 2 vertically moves and rotates the transfer device 13 which is not supporting any container 1 to move the transfer device 13 to the lower second target position that corresponds to the target storage section 6. Next, after the support portion 16 is projected from the reference position to the first target position, the raising-and-lowering transport device 2 raises or lifts the transfer device 13 to the upper second target position to pick up the container 1 from the storage section. Subsequently, the support portion 16 is retracted from the first target position to the reference position.

Thus, the transfer device 13 moves the support portion 16 to the reference position and to the first target position to transfer a container 1 between the support portion 16 and a storage section 6.

[Carry-in-and-Out Transport Device]

Next, the carry-in-and-out transport devices 4 are described.

Each carry-in-and-out transport device 4 has a member (not shown) for supporting a container 1 from below, and is configured to transport a container 1 to its outside location 8 and to its inside location 9 by moving the support member along a spaced-apart direction (which is a direction along which the guide rail 11 and the vertically movable member 12 are spaced apart from each other as seen along the vertical direction X). In addition, each carry-in-and-out transport device 4 is provided with a device (not shown) for rotating the support member about an axis extending along the vertical direction X, and is configured to be capable of changing the attitude of the container 1 to an attitude suitable for the outside location 8 or for the inside location 9 by rotating the support member.

As shown in FIGS. 2 and 3, each inside location 9 is located in a direction, along the spaced-apart direction, in which the vertically movable member 12 is located with respect to the guide rail 11 whereas the corresponding outside location 8 is located in a direction, along the spaced-apart direction, in which the vertically movable member 12 is not located with respect to the guide rail 11.

Provided as the carry-in-and-out transport devices 4 are first carry-in-and-out transport devices 4 each installed near the ceiling, and second carry-in-and-out transport device 4 each installed near the floor surface. A ceiling transport vehicle 3 unloads and pick up a container 1 to and from the outside location 8 of a first carry-in-and-out transport device 4 whereas a floor surface transport vehicle 7 or a worker unloads and pick up a container 1 to and from the outside location 8 of a second carry-in-and-out transport device 4.

[Storage Section]

The storage sections or locations 6 are arranged such that a plurality of storage sections 6 form multiple vertical levels along the vertical direction X, and are also located to be horizontally arranged, or spaced apart from each other, along the circumferential direction Y (i.e., along a circular arc in the horizontal plane) with the rotation axis P at the center. In the present embodiment, as shown in FIG. 4, in each vertical level for which no carry-in-and-out transport device 4 is provided, five storage sections 6 are installed along the circumferential direction Y. And as shown in FIGS. 2 and 3, in each vertical level for which one or more carry-in-and-out transport devices 4 are provided, three or four storage sections 6 are installed along the circumferential direction Y to be horizontally spaced apart from each other. As such, a plurality of storage sections 6 are located to be horizontally spaced apart from each other along the circumferential direction Y (along a circular arc) with the rotation axis P at the center.

The storage sections 6 are described in more detail next. In the following description, the direction, as seen along the vertical direction X, along which the support portion 16 is moved when the transfer device 13 transfers a container 1 between a storage section 6 and a support portion 16, will be referred to as the projecting and retracting direction Z. In addition, the direction, along the projecting and retracting direction Z, that points toward the first target position from the reference position will be referred to as the projecting direction Z1 and the direction, along the projecting and retracting direction Z, that points toward the reference position from the first target position will be referred to as the retracting direction Z2.

As shown in FIG. 5, each of the plurality of storage sections 6 includes a support plate 25 which is generally formed in a shape of a plate (thin material) generally having a U-shape that opens toward the retracting direction Z2 as seen along the vertical direction X, and a reflecting plate 26 as a reflector which is attached to the support plate 25 and has a retroreflective property (i.e. it reflects the incident light back to its source). The support plate 25 of each storage section 6 is provided with three second pins 27 configured to engage recessed portions formed in the bottom of each container 1. Each support plate 25 is configured to support a container 1 from below, with the container 1 properly positioned horizontally with the recessed portions of the container 1 in engagement with the second pins 27. Each storage section 6 can support a container 1 with the container 6 supported from below by the support plate 25 in this manner.

A reflecting plate 26 is attached to an end portion of each support plate 25 on the retracting direction Z2 side.

As shown in FIGS. 6 and 7, the reflecting plate 26 is attached to the support plate 25 such that the light from a light-emitter-receiver 15 is incident on the reflecting plate 26 when the transfer device 13 is located at a proper position which is a proper position for the transfer device 13 with respect to the storage section 6 and the support portion 16 is located at the reference position.

In addition, the reflecting plate 26 has a width along the vertical direction X and a width along the circumferential direction Y (i.e., along a lateral direction). Thus, even if the transfer device 13 is displaced from the proper position along the vertical direction X or the circumferential direction Y (i.e., angularly in the horizontal plane) within a tolerance range, the light from a light-emitter-receiver 15 would still be incident on the reflecting plate 26.

And if the transfer device 13 is displaced from the proper position along the vertical direction X or the circumferential direction Y (i.e., angularly in the horizontal plane) beyond the tolerance range, the light from a light-emitter-receiver 15 would not be incident on the reflecting plate 26, because the light would miss the reflecting plate 26.

Therefore, when the transfer device 13 is located at a proper position, or a position at which the amount of displacement from the proper position is within the tolerance range, then the light from a light-emitter-receiver 15 would be incident on the reflecting plate 26 which reflects the light back to the light-emitter-receiver 15. And when the transfer device 13 is located at a position at which the amount of displacement from the proper position is beyond and outside the tolerance range, then the light from a light-emitter-receiver 15 would not be incident on the reflecting plate 26, in which case the light is not reflected back to the light-emitter-receiver 15 by the reflecting plate 26.

Incidentally, the reflecting plate 26 is attached to the support plate 25 such that, as shown in FIG. 6, the reflecting plate 26 reflects the light from the first light-emitter-receiver 15a back toward the first light-emitter-receiver 15a when the transfer device 13 is located at the upper proper position and the support portion 16 is located at the reference position and such that, as shown in FIG. 7, the reflecting plate 26 reflects the light from the second light-emitter-receiver 15b back toward the second light-emitter-receiver 15b when the transfer device 13 is located at a lower proper position and the support portion 16 is located at the reference position.

Thus, each of the plurality of storage sections 6 has a reflecting plate 26 which reflects the light from a light-emitter-receiver 15 back to the light-emitter-receiver 15 when the transfer device 13 is located at the proper position which is a proper position of the transfer device 13 with respect to the storage section 6.

Note that the upper proper position is set to be the proper position of the transfer device 13 when initiating a transfer of a container 1 from the support portion 16 to a storage section 6 as shown in FIG. 6 whereas the lower proper position is set to be the proper position of the transfer device 13 when initiating a transfer of a container 1 from a storage section 6 to the support portion 16 as shown in FIG. 7.

Figure 10:
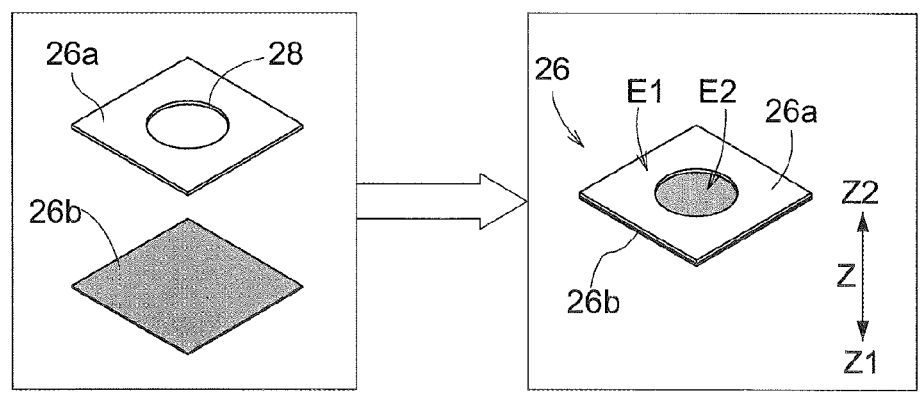
FIG. 10 is a perspective view of a reflecting plate.

As shown in FIG. 10, the reflecting plate 26 has a first area E1 which forms the periphery, or the outer edges, of the reflecting plate 26 as seen along the projecting direction Z1, and a second area E2 which is located inward of the first area E1 and whose entire periphery is surrounded by the first area E1. The relationship (spectral distribution) between the reflectance and the wave length of the reflected light is different between the first area E1 and the second area E2. Thus, at least one of hue, brightness (or value), and chroma is different between the first area E1 and the second area E2 so that the first area E1 and the second area E2 have different colors.

The reflecting plate 26 is described in more detail. The reflecting plate 26 comprises a first plate 26a which forms the first area E1, and a second plate 26b which forms the second area E2. The first plate 26a is formed such that its periphery have the same shape as the periphery of the first area E1 and such that it has a through hole 28 formed in it which has the same shape as the periphery of the second area E2 and which extends along the projecting and retracting direction Z (projecting direction Z1). The second plate 26b is located on the projecting direction Z1 side of the first plate 26a, and is so located to cover and close the through hole 28 in the first plate 26a. The shape formed by the periphery (periphery of the first area E1) of the first plate 26a is generally rectangular in shape whereas the shape of the through hole 28 of the first plate 26a (shape formed by the periphery of the second area E2) is generally circular in shape.

And the first plate 26a consists of a white retroreflective sheet whereas the second plate 26b consists of a red retroreflective sheet. Thus, because the reflecting plate 26 has the first area E1 and the second area E2 which have different colors, when an imaging device 32 described below captures an image of the reflecting plate 26, the boundary between the first area E1 and the second area E2 in the image can be recognized or determined accurately based on the captured information, which makes it easier to properly recognize or determine the outline of the second area E2.

The reflecting plate 26 is formed such that the first plate 26a and the second plate 26b are placed in surface contact with each other along the projecting direction Z1 such that the second plate 26b is located on the projecting direction Z1 side of the first plate 26a. The first area E1 is formed by the surface of the first plate 26a that faces toward the retracting direction Z2. And the second area E2 is formed by the portion (of the surface of the second plate 26b that faces toward the retracting direction Z2) that is visible through the through hole 28.

[Transport Controller]

The article transport facility includes a transport controller 30 for controlling the raising-and-lowering transport device 2.

Stored in the transport controller 30 are information that indicates a first target position and information that indicates second target positions, for each of the plurality of storage sections 6 and the plurality of inside locations 9.

Figure 12:
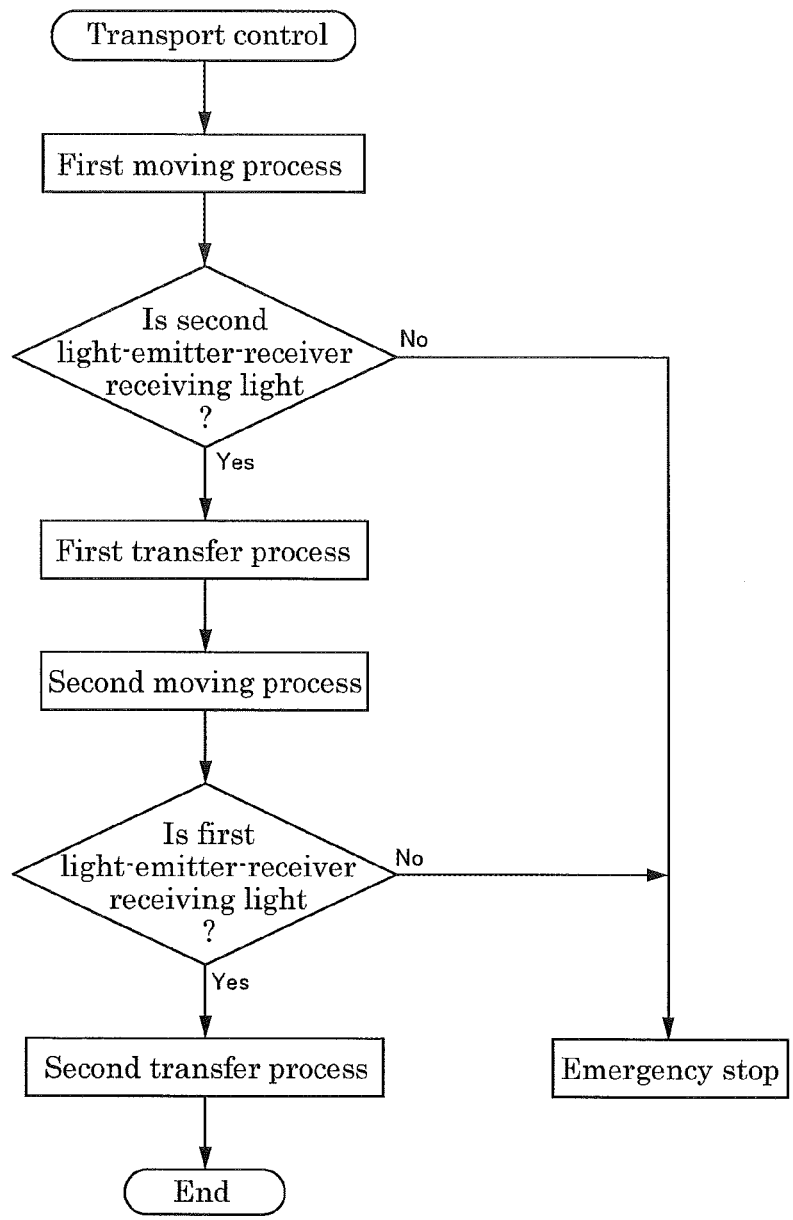
FIG. 12 is a flowchart for a transport control.

As shown in FIG. 12, the processes performed in a transport control include a first moving process, a first confirming process, a first transfer process, a second moving process, a second confirming process, and a second transfer process.

The first moving process is a control for causing the first motor M1 and the second motor M2 to operate to move the transfer device 13 to the lower second target position that corresponds to a storage section 6 or an inside location 9 that is the target of a transfer process. The first confirming process is a process for confirming whether or not the reflecting plate 26 is reflecting the light emitted by the second light-emitter-receiver 15b and the second light-emitter-receiver 15b is receiving the reflected light. The first transfer process is a process for controlling the first motor M1 and the third motor M3 to cause the support portion 16 to be projected from the reference position to the first target position, then causing the transfer device 13 to be raised to the upper second target position, and subsequently, causing the support portion 16 to be retracted from the first target position to the reference position.

The second moving process is a control for causing the first motor M1 and the second motor M2 to operate to move the transfer device 13 to the upper second target position that corresponds to a storage section 6 or an inside location 9 that is the target of a transfer process. The second confirming process is a process for confirming whether or not the reflecting plate 26 is reflecting the light emitted by the first light-emitter-receiver 15a and the first light-emitter-receiver 15a is receiving the reflected light. The second transfer process is a process for controlling the first motor M1 and the third motor M3 to cause the support portion 16 to be projected from the reference position to the first target position, then causing the transfer device 13 to be lowered to the lower second target position, and subsequently, causing the support portion 16 to be retracted from the first target position to the reference position.

A transport control is described in more detail next, by discussing an example in which a container 1 is transported from an inside location 9 to a storage section 6.

First, the transport controller 30 performs the first moving process for causing the transfer device 13 to be moved to the lower second target position that corresponds to an inside location 9, then, performs the first confirming process, and subsequently performs the first transfer process if the second light-emitter-receiver 15b is receiving light. By performing the first transfer process in this manner, the container 1 is transferred from the inside location 9 to the support portion 16 of the transfer device 13.

Next, the transport controller 30 performs the second moving process for causing the transfer device 13 to be moved to the upper second target position that corresponds to a storage section 6, then, performs the second confirming process, and subsequently performs the second transfer process if the first light-emitter-receiver 15a is receiving light. By performing the second transfer process in this manner, the container 1 is transferred from the support portion 16 of the transfer device 13 to the storage section 6.

And the transport controller 30 performs an emergency stop process for suspending the transport control if the second light-emitter-receiver 15b is determined to be not receiving light in the first confirming process, or if the first light-emitter-receiver 15a is determined to be not receiving light in the second confirming process.

Thus, the transport control is a control for causing the first motor M1, the second motor M2, and the third motor M3 to operate to cause the transfer device 13 to be moved to a second target position that corresponds to the storage section 6 that is the target of the transfer process, and subsequently to cause the support portion 16 to be moved from the reference position to the first target position if the reflecting plate 26 is reflecting the light emitted by a light-emitter-receiver 15 and the light-emitter-receiver 15 is receiving the reflected light.

[Learning Module]

The article transport facility is provided with a learning module 31 (a module used for a learning operation) which is used when learning first target positions and second target positions. This learning module 31 is supported by the support portion 16 as shown in FIG. 8, when a controller H described below performs a learning control.

Figure 8:
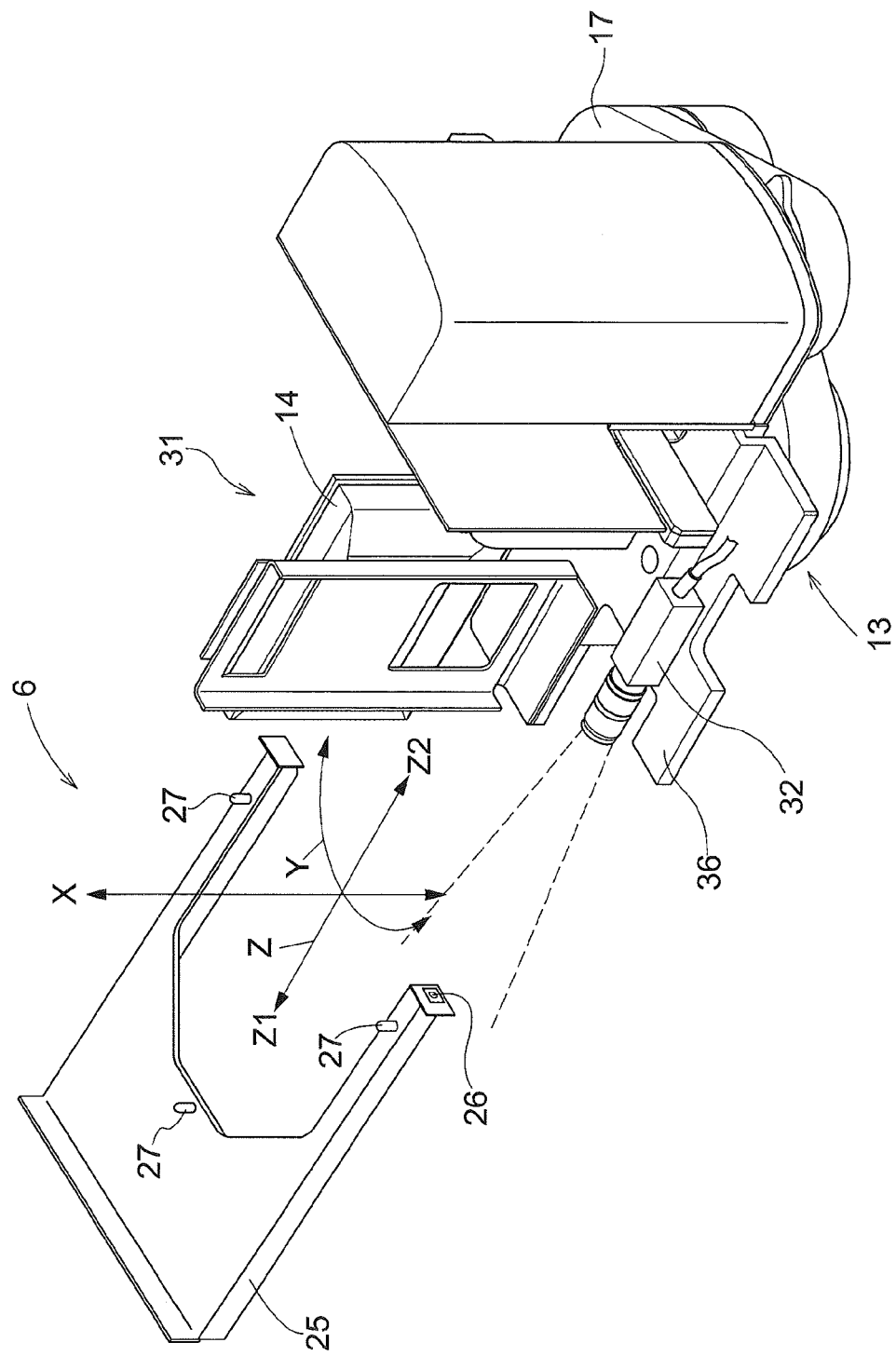
FIG. 8 is a perspective view showing a storage section and the transfer device supporting a learning module.

As shown in FIG. 8, the learning module 31 has an imaging device 32 configured to capture images of reflecting plates 26, an illuminating device 33 (see FIG. 11) configured to emit light toward the reflecting plate 26, a display 34 for displaying the images captured by the imaging device 32, and a learning controller 35 (see FIG. 11).

The imaging device 32, the illuminating device 33, the display 34, and the learning controller 35 are fixed to a base platform 36 so that these components are integrated into the learning module 3. In addition, the learning module 31 is configured to be removably mounted or attached to the support portion 16. And with the learning module 31 attached to and supported by the support portion 16, the learning module 31 is vertically moved and rotated integrally with the transfer device 13 as the transfer device 13 is vertically moved and rotated.

The learning module 31 has one monocular imaging device 32 as the imaging device 32. And as shown in FIG. 6, the imaging device 32 is provided to, and located in the learning module 31 such that, when the transfer device 13 is located at the upper proper position with respect to a storage section 6 and the support portion 16 is located at the reference position, the imaging device 32 is located directly in front of the reflecting plate 26 and the imaging device 32 can capture an image of the reflecting plate 26.

The learning controller 35 has stored in its memory a plurality of pieces of pattern image information and a plurality of pieces of displacement amount information for a plurality of corresponding pattern images such that there is a correspondence relation between the plurality of pieces of pattern image information and the plurality of pieces of displacement amount information. The plurality of pieces of pattern image information includes information of an image when the image of the reflecting plate 26 is captured by the imaging device 32 with the transfer device 13 located at the proper position (upper proper position) and information of images when images of the reflecting plate 26 captured by the imaging device 32 with the transfer device 13 located at positions displaced from the proper position by different amounts of displacement indicated by the displacement amount information.

Figure 9:
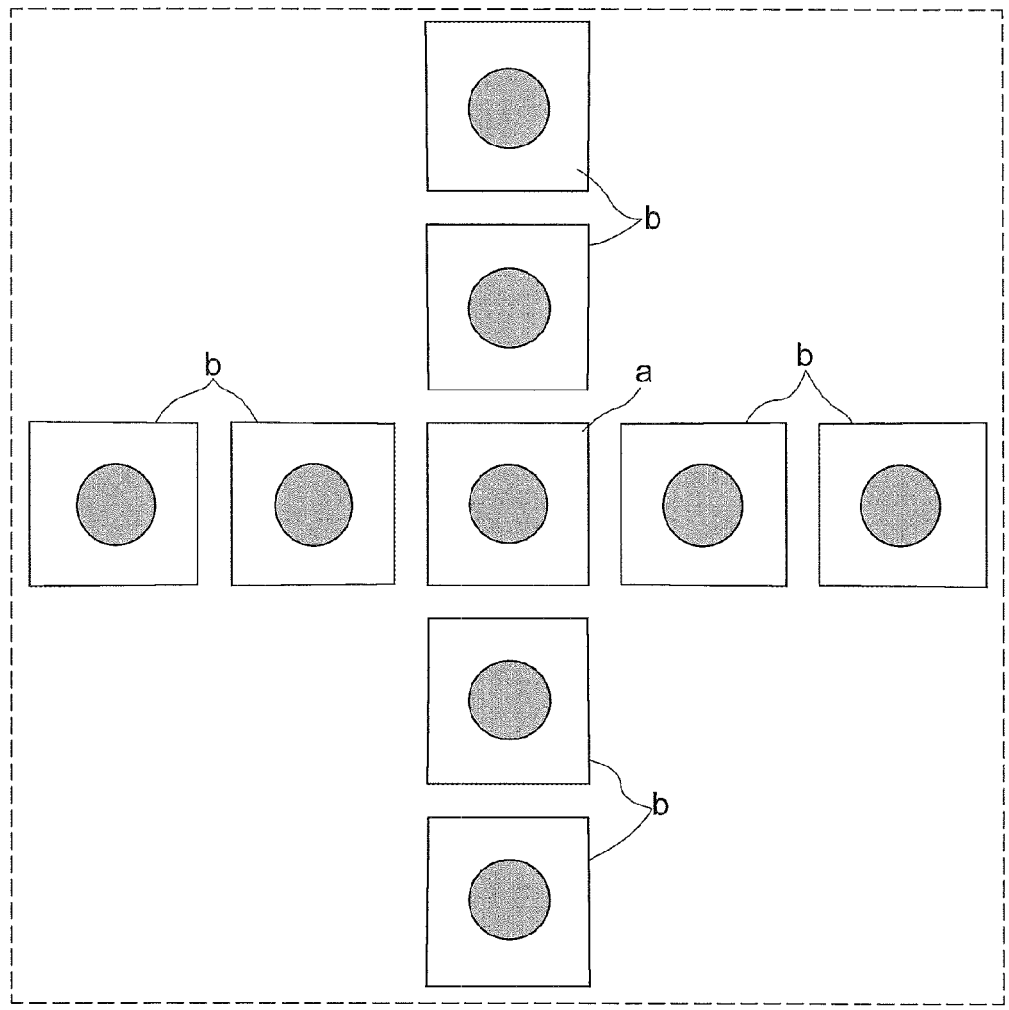
FIG. 9 shows a primary pattern image and secondary pattern images.

In the present embodiment, as shown in FIG. 9, the learning controller 35: generates a primary pattern image "a" by capturing an image of the reflecting plate 26 when the transfer device 13 is located at the proper position; and based on the primary pattern image "a", generates, as secondary pattern images "b", images that are expected to be, or that would be, captured when the reflecting plate 26 and the imaging device 32 are displaced relative to each other along the vertical direction X, the circumferential direction Y (i.e., angularly in the horizontal plane), and the projecting and retracting direction Z. And the learning controller 35: stores the primary pattern image "a" and a plurality of secondary pattern images "b", as the plurality of pieces of pattern image information; and stores the primary pattern image "a"

such that it corresponds to, or is associated with, the displacement amount information that indicates zero as the amount of displacement; and stores the plurality of secondary pattern images "b" such that each corresponds to, or is associated with, the displacement amount information that indicates an expected amount of displacement.

A learning control is performed by collaboration between the transport controller 30 and the learning controller 35. And the controller H which performs the transport control and the learning control consists of the transport controller 30 and the learning controller 35. The transport controller 30 and the learning controller 35 are configured to transmit and receive information to and from each other by wireless communication.

The transport controller 30 is configured to be switched between a work mode and a learning mode.

The work mode is a mode in which the transport controller 30 performs a transport control based on transport command information issued from a transport command device (not shown) to the transport controller 30. For example, when the transport controller 30 is in the work mode and the transport controller 30 receives transport command information for transporting a container 1 from an inside location 9 to a storage section 6, the transport controller 30 performs a transport control to transport the container 1 from the specified inside location 9 to the storage section 6. And when the transport controller 30 is in the learning mode, the transport controller 30 performs a learning control in collaboration with the learning controller 35 based on learning information inputted into the transport controller 30. Note that learning information is information that specifies one or more storage sections 6 and/or one or more inside locations 9 that are the targets of learning.

Next, the learning control is described in more detail.

Figure 13:
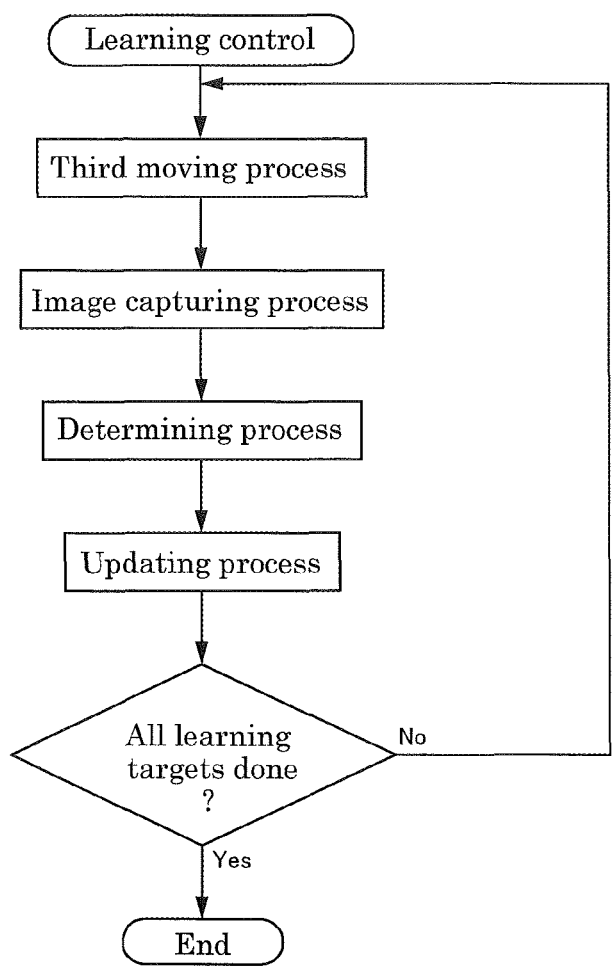
FIG. 13 is a flowchart for a learning control.

As shown in FIG. 13, performed in a learning control are a third moving process, an image capturing process, a determining process, and an updating process.

The third moving process is a control for causing the first motor M1 and the second motor M2 to operate to move the transfer device 13 to the upper second target position that corresponds to a storage section 6 or an inside location 9 that is the target of the learning. The image capturing process is a control for operating the imaging device 32 to cause it to capture an image of the reflecting plate 26 with the imaging device 32. The determining process is a process for selecting (from the plurality of pieces of pattern image information and based on the information of an image captured by the imaging device 32 in the image capturing process) the pattern image information that indicates the pattern image that is close, or the closest, to the captured image. The updating process is a control for storing the first target position and the second target position of a storage section 6 or an inside location 9 that is the target of the learning, based on information on the pre-learning position (pre-learning position information) and the displacement amount information that corresponds to the pattern image information selected in the determining process.

Thus, the learning control is a control in which, from the plurality of pieces of pattern image information and based on the information of an image captured by the imaging device 32 in the image capturing process, the pattern image information of the pattern image that is close to the captured image is selected, and in which the first target position and the second target position of a storage section 6 that is the target of the learning are learned based on the pre-learning position information and the displacement amount information that corresponds to the selected pattern image information, by performing a third moving process, an image capturing process, a determining process, and an updating process, in that order.

Incidentally, when neither the first target positions nor the second target positions are stored in the transport controller 30 after the article transport facility is newly installed and before the initial operation of the article transport facility, a worker inputs into the transport controller 30 information that indicates the pre-learning positions: and a learning control is performed by using the inputted information as the pre-learning position information. It is preferable to input position information for the upper proper positions as the information that indicates the pre-learning positions.

In addition, when performing the learning control after the initial operation of the article transport facility with the information that indicates the first target positions and the second target positions already stored in the transport controller 30 (such as when the second target positions need to be learned again, because, for example, the second target positions became displaced from the proper positions due to changes that occur over time), the learning control (for the relearning) is performed by using the information indicating the upper second target positions stored in the transport controller 30 as the pre-learning position information.

The learning control is described using an example in which a plurality of storage sections 6 are specified, in learning information, as storage sections 6 (target storage sections 6) that are the targets for the learning.

First, the transport controller 30 performs a third moving process to cause the transfer device 13 to be moved to the pre-learning position that corresponds to one of the target storage sections 6, subsequently performs an image capturing process to capture an image of the reflecting plate 26 for the first target storage section 6 with the imaging device 32. Next, the transport controller 30 performs a determining process to select, from a plurality of pieces of pattern image information, pattern image information that indicates the pattern image that is close, or closest, to the captured image. And the first target position is learned based on the displacement amount information (displacement amount information for the projecting and retracting direction Z) that corresponds to the selected pattern image information while the upper second target position is learned based on the displacement amount information (displacement amount information for the vertical direction X and the circumferential direction Y (i.e., angular displacement in the horizontal plane)). The lower second target position is learned based on this displacement amount information and information of a preset vertical distance between the upper second target position and the lower second target position.

Subsequently, a determination is made as to if the learning is completed for all of the storage sections 6 specified in the learning information. If the learning for all of the specified sections 6 is not completed, the third moving process, the image capturing process, the determining process, and the updating process are repeatedly performed. And if the learning is completed for all specified storage sections 6, the learning control is terminated.

Incidentally, in the present embodiment, the vertical distance between the upper second target position and the lower second target position is set to be the same as the distance by which the transfer device 13 is vertically moved in the first transfer process and the second transfer process. However, the distance by which the transfer device 13 is vertically moved in the first transfer process or the second transfer process may be different from the vertical distance between the upper second target position and the lower second target position.

Thus, the learning control is a control for learning the first target position and the second target position for a storage section 6 that is the target of learning and specified in the learning information, based on: (a) the information of the image of the reflecting plate 26 captured by the imaging device 32 with the learning module 31 supported by the transfer device 13 and with the transfer device 13 located at the pre-learning position (first target position before the learning through the learning control) that corresponds to the storage section 6 that is the target of the learning; and (b) information indicating the pre-learning position (first target position before the learning by the learning control).

Alternative Embodiments (1) In the embodiment described above, the periphery of the first area is generally rectangular in shape and the periphery of the second area is generally circular in shape. However, the shapes of the first and the second areas may be changed as appropriate.

More specifically, the first area may be generally circular in shape and the second area may be generally polygonal in shape, for example. In addition, shape of the second area may be such as to form, for example, a shape of a two dimensional matrix code that includes information such as the address of a storage section, etc. In addition, although the shape of the first area is preferably different from the shape of the second area, they may have the same shape.

Also, in the embodiment described above, the second area is provided to the reflector such that the entire periphery of the second area is surrounded by the first area. However, the second area may be provided to the reflector such that the second area extends to, and forms a part of, the periphery of the reflector. As such, the second area may be provided to the reflector such that a part of the second area is not surrounded by the first area.

(2) In the embodiment described above, the second plate is located on the projecting direction side of the first plate. However, the periphery of the second plate may be formed in a shape that forms the periphery of the second area without forming a through hole in the first plate. And the second plate may be located on the retracting direction side of the first plate. In addition, although the reflector is formed by two generally plate-shaped members, namely the first plate and the second plate, the reflector may be formed with a single generally plate-shaped member.

(3) In the embodiment described above, the first area is white whereas the second area red; however, the colors of the first and the second areas may be changed from these colors as appropriate. In addition, the first area and the second area only need to be configured such that the first area and the second area can be recognized or determined as having different colors by the imaging device, for example, when capturing their image with an infrared camera used as the imaging device, and/or when capturing their image with a camera with the reflecting plate illuminated by a black light, among other possibilities.

(4) In the embodiment described above, the controller: stores a plurality of pieces of pattern image information and a plurality of pieces of displacement amount information such that there is a correspondence relation between these two kinds of information; selects, in a learning control, pattern image information of the pattern image that is close, or closest, to the image of the reflector captured by the imaging device; and learns the first target position and the second target position based on the pre-learning position and the displacement amount information that corresponds to the pattern image information. However, the following learning control may be used instead, and as such, the specific process for the learning control for learning the first target position and the second target position based on information of the image of the reflector captured by the imaging device and the pre-learning position information may be modified or changed as appropriate.

Specifically, in a learning control, the position of the periphery of the first area and the position of the periphery of the second area are determined from the image information of the reflector captured by the imaging device. And the displacement amount along the vertical direction, the circumferential direction (i.e., angular displacement in the horizontal plane), and the projecting and retracting direction are calculated based on the size or dimensions of the first area and the second area along the image lateral direction and the image vertical direction. And the first target position and the second target position are learned based on the amount of displacement obtained by this calculation and the pre-learning position information.

In addition, in the embodiment described above, the upper second target position is learned based on the displacement amount information (displacement amount information along the vertical direction X and the circumferential direction Y (angular displacement in the horizontal plane)). And the lower second target position is learned based on this displacement amount information and the preset information on the vertical distance between the upper second target position and the lower second target position. However, the lower second target position may be learned based on the displacement amount information (displacement amount information along the vertical direction X and the circumferential direction Y). And the upper second target position may be learned based on this displacement amount information and the preset vertical distance information.

(5) In the embodiment described above, a plurality of storage sections are arranged such that they are spaced apart from each other along the vertical direction and along the circumferential direction (i.e., along a circular arc in the horizontal plane). The plurality of storage sections may be arranged in vertical rows and linear rows each extending along a lateral direction perpendicular to the vertical direction. In this case, as a transport device, a stacker crane may be used which is configured to move the transfer device along the vertical direction and the lateral direction through horizontal traveling of its travel carriage and vertical movement of a vertically movable member.

In addition, the storage sections may be arranged along only one of the vertical direction, the circumferential direction, and the lateral direction. In addition, when a plurality of storage sections are arranged along the circumferential direction (i.e., along a circular arc in the horizontal plane), only four storage sections may be arranged along the circumferential direction in a vertical level of the storage sections with no carry-in-and-out transport device. Thus, the number of the storage sections arranged along the circumferential direction may be changed as appropriate.

Incidentally, the distance between any two adjacent storage sections arranged along the circumferential direction, and/or the distance between the storage sections and the transfer device may be changed as appropriate. In addition, a transport device or device, other than the raising-and-lowering transport device or a stacker crane, such as a ceiling or overhead transport vehicle and a floor surface travel vehicle may be used instead.

Summary of Embodiments Described Above

A brief summary of the article transport facility described above is provided next.

An article transport facility comprises a plurality of storage sections, a transport device configured to transport an article to any one of the plurality of storage sections, a controller for controlling operation of the transport device; and a learning module.

The transport device has a transfer device having a support portion configured to support an article, a first actuator configured to move the transfer device, and a light-emitter-receiver configured to be moved integrally with the transfer device, wherein the transfer device is provided with a second actuator configured to move the support portion, and is configured to transfer an article between the support portion and a storage section by moving the support portion between a reference position and a first target position at which the support portion is projected from the reference position in a direction in which the storage section is located, wherein, for each of the plurality of storage sections, the controller stores information that indicates a second target position at which the transfer device is located when the transfer device transfers an article between the support portion and the storage section, as well as information that indicates the first target position, wherein the light-emitter-receiver is positioned to emitted light along a projecting direction which points toward the first target position from the reference position, wherein each of the plurality of storage sections is provided with a reflector configured to reflect light from the light-emitter-receiver back toward the light-emitter-receiver when the transfer device is located at a proper position which is a proper position for the transfer device with respect to the storage section, wherein the learning module has only one monocular imaging device configured to capture an image of the reflector, wherein the controller is configured to perform a movement control and a learning control, wherein the movement control is a control for causing the first actuator and the second actuator to operate to cause the transfer device to be moved to a second target position that corresponds to the storage section that is a target of transfer, and subsequently to cause the support portion to be moved from the reference position to the first target position if the reflector is reflecting the light emitted by the light-emitter-receiver and the light-emitter-receiver is receiving the reflected light, wherein the learning control is a control for learning the first target position and the second target position for a storage section that is a target of learning, based on: (a) information of an image of the reflector captured by the imaging device with the learning module supported by the transfer device and with the transfer device located at a pre-learning position that corresponds to a storage section that is a target of learning; and (b) information indicating the pre-learning position, wherein the reflector has a first area which forms a periphery of the reflector as seen along the projecting direction, and a second area surrounded by the first area in the first area, and wherein a relationship between reflectance and wave length of reflected light for the first area is different from a relationship between reflectance and wave length of reflected light for the second area.

With the arrangement above, the controller can transfer an article between the support portion and a storage section by performing the movement control to first cause the transfer device to be moved to the second target position for the storage section, and subsequently to cause the support member to be moved between the reference position and the first target position.

In addition, by performing the learning control, the controller can learn the first target position and the second target position for the storage section that is the target of learning based on (a) information of an image of the reflector captured by the imaging device with the learning module supported by the transfer device and with the transfer device located at the pre-learning position that corresponds to the storage section that is the target of learning, and (b) information indicating the pre-learning position.

And by capturing an image of the reflector that reflects the light from the light-emitter-receiver with the imaging device, it is not necessary to provide each storage section with a separate member of which the imaging device captures an image in a learning control, which simplifies the structure of each storage section. In addition, since the learning module has only one monocular imaging device, any increase in size or in manufacturing cost of the learning module can be reduced compared with the case in which two monocular imaging devices are provided to a learning module.

In addition, the reflector has a first area which forms a periphery of the reflector as seen along the projecting direction, and a second area surrounded by the first area in the first area. And the relationship between reflectance and wave length of reflected light for the first area is different from the relationship between reflectance and wave length of reflected light for the second area. Thus, the controller can recognize or determine the size and shape of the reflector based on the size and the shape of the second area in addition to the size and the shape of the periphery of the first area, in an image captured by the imaging device, which makes it easier for the controller to recognize or determine the size and the shape of the reflector based on an image captured by the imaging device.

In addition, since at least a portion of the second area formed in the first area is surrounded by the first area, even when the periphery of the first area that forms the periphery of the reflecting plate is hard to be recognized due to some external light, at least a portion of the second area is located inside the periphery of the reflecting plate and is thus less susceptible to such external light, which makes it easier to recognize or determine the size and the shape of at least a part of the second area.

Thus, the article transport facility can be provided with reflecting plates that allow their shape and size to be recognized or determined properly when their images are captured by the imaging device.

Here, the reflector preferably has a first plate that forms the first area, and a second plate that forms the second area, wherein the first plate is preferably formed such that a periphery thereof have a same shape as a periphery of the first area and such that a through hole is formed in the first plate which has a same shape as a shape of a periphery of the second area and which extends along the projecting direction, and wherein the second plate is preferably located on a projecting direction side of the first plate, and is so located to cover and close the through hole formed in the first plate.

With the arrangement above, the through hole formed in the first plate has the same shape as the periphery of the second area; thus, by locating the second plate on the projecting direction side of the first plate such that the through hole formed in the first plate is closed by the second plate, the second area can be formed by the portion of the second plate that can be visible through the through hole. Therefore, even if the second plate is displaced somewhat relative to the first plate, precise alignment between the first area and the second area, to prevent the second area from being displaced relative to the first area when placing the first plate and the second plate in surface contact with each other or against each other, is unnecessary.

In addition, the controller preferably stores a plurality of pieces of pattern image information that indicate respective pattern images and a plurality of pieces of displacement amount information such that there is a correspondence relation between the plurality of pieces of pattern image information and the plurality of pieces of displacement amount information, wherein the plurality of pieces of pattern image information preferably includes information of an image of the reflector when captured by the imaging device with the transfer device located at the proper position and information of images of the reflector when captured by the imaging device with the transfer device located at positions displaced from the proper position by corresponding amounts of displacement indicated by the plurality of pieces of displacement amount information, and wherein the learning control is preferably a control in which, from the plurality of pieces of pattern image information and based on the information of a captured image captured by the imaging device, pattern image information of a pattern image that is close to the captured image is selected, and in which the first target position and the second target position of the storage section that is the target of learning are learned based on the pre-learning position information and displacement amount information that corresponds to the selected pattern image information.

With the arrangement above, the learning process can be simplified because a plurality of pieces of pattern image information are stored before the learning control is performed, and because, in the learning control, displacement amount information between the proper position on the one hand and the first target position and the second target position on the other hand can be obtained by selecting the pattern image that is close to the image captured by the imaging device, compared with, for example, a case in which the position of the periphery of the first area and the position of the periphery of the second area are determined from the information of the image of the reflector captured by the imaging device and in which the amount of displacement is calculated based on the size, etc., of the first area and the second area along the image lateral direction and along the image vertical direction.

In addition, the first actuator preferably includes a vertical movement actuator configured to move transfer device along a vertical direction, and a rotating movement actuator configured to rotate the transfer device about a rotation axis extending along the vertical direction, and wherein some of the plurality of storage sections are preferably arranged along a circumferential direction with the rotation axis at center thereof, as seen along the vertical direction.

With the arrangement above, the distance between the transfer device and the storage sections tends to increase as the number of the storage sections arranged along the circumferential direction increases. And when a pair of imaging devices are provided with one pointed straight forward and the other imaging device pointed at an angle, the two imaging devices need to be located with a large distance between them as the distance between the storage sections and the imaging devices increases. This tends to increase the size of the learning module. Since only one imaging device is provided to the learning module in the arrangement described above, increase in the size of the learning module can be avoided even when the storage sections are arranged as described above.

In addition, a periphery of the first area is preferably generally rectangular in shape whereas a periphery of the second area is preferably generally circular in shape.

With the arrangement above, since the periphery of the first area is generally rectangular in shape, even when the transfer device is displaced from its proper position by a distance that is within a range that corresponds to the vertical dimension of the reflector or by a distance that is within a range that corresponds to the lateral dimension of the reflector, the light from the light-emitter-receiver can be reflected back by the reflector to the light-emitter-receiver.

And the periphery of the second area is generally circular in shape; thus, if there is no other object that is circular in shape exits in or around the storage section, it would be difficult for an object whose image is captured with the reflector in the image captured by the imaging device to be mistakenly interpreted as the second area.

What is claimed is:

1. An article transport facility comprising:
   a plurality of storage sections;
   a transport device configured to transport an article to any one of the plurality of storage sections;
   a controller for controlling operation of the transport device; and
   a learning module;
   wherein the transport device has a transfer device having a support portion configured to support an article, a first actuator configured to move the transfer device, and a light-emitter-receiver configured to be moved integrally with the transfer device,
   wherein the transfer device is provided with a second actuator configured to move the support portion, and is configured to transfer an article between the support portion and a storage section by moving the support portion between a reference position and a first target position at which the support portion is projected from the reference position in a direction in which the storage section is located,
   wherein, for each of the plurality of storage sections, the controller stores information that indicates a second target position at which the transfer device is located when the transfer device transfers an article between the support portion and the storage section, as well as information that indicates the first target position,
   wherein the light-emitter-receiver is positioned to emitted light along a projecting direction which points toward the first target position from the reference position,
   wherein each of the plurality of storage sections is provided with a reflector configured to reflect light from the light-emitter-receiver back toward the light-emitter-receiver when the transfer device is located at a proper position which is a proper position for the transfer device with respect to the storage section,
   wherein the learning module has only one monocular imaging device configured to capture an image of the reflector,
   wherein the controller is configured to perform a movement control and a learning control,
   wherein the movement control is a control for causing the first actuator and the second actuator to operate to cause the transfer device to be moved to a second target position that corresponds to the storage section that is a target of transfer, and subsequently to cause the support portion to be moved from the reference position to the first target position if the reflector is reflecting the light emitted by the light-emitter-receiver and the light-emitter-receiver is receiving the reflected light, wherein the learning control is a control for learning the first target position and the second target position for a storage section that is a target of learning, based on: (a) information of an image of the reflector captured by the imaging device with the learning module supported by the transfer device and with the transfer device located at a pre-learning position that corresponds to a storage section that is a target of learning; and (b) information indicating the pre-learning position, wherein the reflector has a first area which forms a periphery of the reflector as seen along the projecting direction, and a second area surrounded by the first area in the first area, and wherein a relationship between reflectance and wave length of reflected light for the first area is different from a relationship between reflectance and wave length of reflected light for the second area.

2. The article transport facility as defined in claim 1, wherein the reflector has a first plate that forms the first area, and a second plate that forms the second area, wherein the first plate is formed such that a periphery thereof have a same shape as a periphery of the first area and such that a through hole is formed in the first plate which has a same shape as a shape of a periphery of the second area and which extends along the projecting direction, and wherein the second plate is located on a projecting direction side of the first plate, and is so located to cover and close the through hole formed in the first plate.

3. The article transport facility as defined in claim 1, wherein the controller stores a plurality of pieces of pattern image information that indicate respective pattern images and a plurality of pieces of displacement amount information such that there is a correspondence relation between the plurality of pieces of pattern image information and the plurality of pieces of displacement amount information, wherein the plurality of pieces of pattern image information includes information of an image of the reflector when captured by the imaging device with the transfer device located at the proper position and information of images of the reflector when captured by the imaging device with the transfer device located at positions displaced from the proper position by corresponding amounts of displacement indicated by the plurality of pieces of displacement amount information, and wherein the learning control is a control in which, from the plurality of pieces of pattern image information and based on the information of a captured image captured by the imaging device, pattern image information of a pattern image that is close to the captured image is selected, and in which the first target position and the second target position of the storage section that is the target of learning are learned based on the pre-learning position information and displacement amount information that corresponds to the selected pattern image information.

4. The article transport facility as defined in claim 1, wherein the first actuator includes a vertical movement actuator configured to move transfer device along a vertical direction, and a rotating movement actuator configured to rotate the transfer device about a rotation axis extending along the vertical direction, and wherein some of the plurality of storage sections are arranged along a circumferential direction with the rotation axis at center thereof, as seen along the vertical direction.

5. The article transport facility as defined in claim 1, wherein a periphery of the first area is generally rectangular in shape whereas a periphery of the second area is generally circular in shape.

* * * * *